(12) United States Patent
Chiang et al.

(10) Patent No.: US 10,937,719 B2
(45) Date of Patent: Mar. 2, 2021

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Yung-Ping Chiang, Hsinchu County (TW); Chao-Wen Shih, Hsinchu County (TW); Min-Chien Hsiao, Taichung (TW); Nien-Fang Wu, Chiayi (TW); Shou-Zen Chang, Hsinchu (TW); Yi-Che Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 420 days.

(21) Appl. No.: 15/638,386

(22) Filed: Jun. 30, 2017

(65) Prior Publication Data
US 2018/0269139 A1  Sep. 20, 2018

Related U.S. Application Data

(60) Provisional application No. 62/474,021, filed on Mar. 20, 2017.

(51) Int. Cl.
*H01L 23/495* (2006.01)
*H01L 23/66* (2006.01)
(Continued)

(52) U.S. Cl.
CPC ...... *H01L 23/49548* (2013.01); *H01L 21/561* (2013.01); *H01L 21/568* (2013.01); *H01L 21/6835* (2013.01); *H01L 23/3107* (2013.01); *H01L 23/4334* (2013.01); *H01L 23/49575* (2013.01); *H01L 23/5389* (2013.01); *H01L 23/66* (2013.01); *H01L 25/162* (2013.01); *H01L 25/165* (2013.01); *H01P 1/2005* (2013.01); *H01P 1/30* (2013.01); *H01P 3/026* (2013.01); *H01Q 1/2283* (2013.01); *H01Q 15/0086* (2013.01); *H01Q 21/062* (2013.01); *H01L 23/49838* (2013.01);
(Continued)

(58) Field of Classification Search
CPC . H01L 23/49548; H01L 23/66; H01L 25/162; H01L 25/165; H01L 23/4334; H01L 23/3107; H01L 23/49575; H01P 3/026; H01P 1/30
See application file for complete search history.

(56) References Cited

U.S. PATENT DOCUMENTS 9,000,584 B2    4/2015   Lin et al.
9,048,222 B2    6/2015   Hung et al.
(Continued)

*Primary Examiner* — Graham P Smith
*Assistant Examiner* — Jae K Kim
(74) *Attorney, Agent, or Firm* — JCIPRNET

(57) ABSTRACT

A package structure comprising a die, a first molding compound encapsulating the die, an antenna structure and a reflector pattern disposed above the die is provided. Through vias penetrating through the first molding compound are disposed around the die. The reflector pattern is disposed on the die and the through vias. The antenna structure is disposed on the reflector pattern and electrically connected with the reflector pattern and the die. The antenna structure is wrapped by a second molding compound disposed on the reflector pattern.

20 Claims, 9 Drawing Sheets

(51) Int. Cl.
*H01L 25/16* (2006.01)
*H01P 1/30* (2006.01)
*H01P 3/02* (2006.01)
*H01L 23/31* (2006.01)
*H01L 23/433* (2006.01)
*H01Q 21/06* (2006.01)
*H01L 21/56* (2006.01)
*H01Q 15/00* (2006.01)
*H01Q 1/22* (2006.01)
*H01L 21/683* (2006.01)
*H01P 1/20* (2006.01)
*H01L 23/538* (2006.01)
*H01L 23/498* (2006.01)

(52) U.S. Cl.
CPC ............... *H01L 2221/68318* (2013.01); *H01L 2221/68359* (2013.01); *H01L 2221/68372* (2013.01); *H01L 2221/68381* (2013.01); *H01L 2224/18* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,269,732 B2* | 4/2019 | Yu | H01L 23/3114 |
| 2008/0296710 A1* | 12/2008 | Tonucci | G02F 1/015 |
| | | | 257/421 |
| 2015/0349428 A1* | 12/2015 | Kashino | H01Q 13/106 |
| | | | 343/770 |
| 2016/0329299 A1* | 11/2016 | Lin | H01L 23/3128 |
| 2017/0345731 A1* | 11/2017 | Chiang | G06K 9/0002 |
| 2018/0115061 A1* | 4/2018 | Ito | H01Q 23/00 |

* cited by examiner

PACKAGE STRUCTURE AND METHOD OF FABRICATING THE SAME

CROSS-REFERENCE TO RELATED APPLICATION

This application claims the priority benefit of U.S. provisional application Ser. No. 62/474,021, filed on Mar. 20, 2017. The entirety of the above-mentioned patent application is hereby incorporated by reference herein and made a part of this specification.

BACKGROUND

Many semiconductor devices and integrated circuits used in a variety of electronic applications, such as cell phones and other mobile electronic equipment, are manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
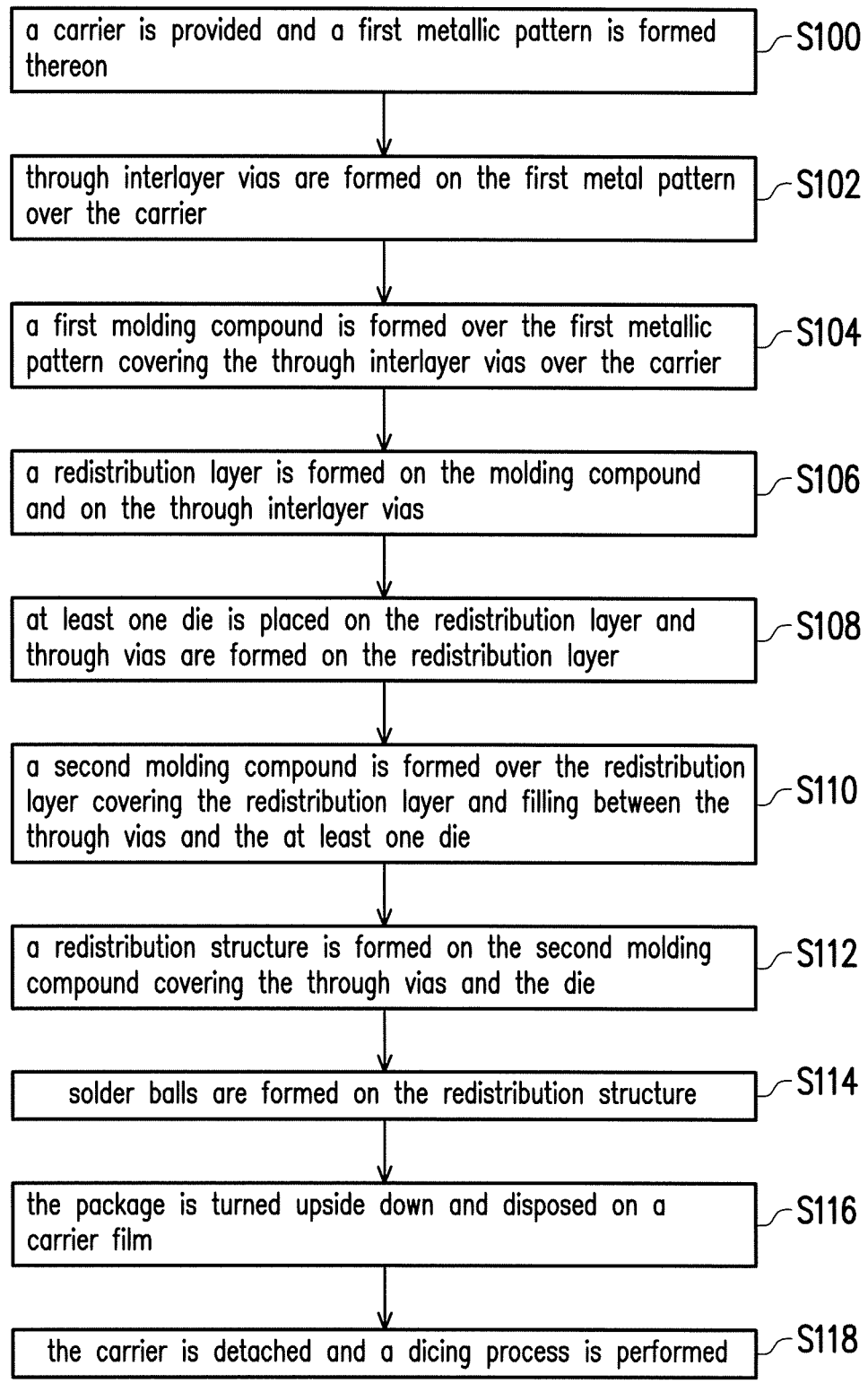
FIG. 1 is an exemplary flow chart showing the process steps of the method of fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is an exemplary flow chart showing the process steps of the method of fabricating a package structure in accordance with some embodiments of the present disclosure. The various process steps of the process flow illustrated in FIG. 1 may comprise multiple process steps as discussed below. FIGS. 2A-2J are the schematic cross-sectional views showing the package structure at various stages of the method of fabricating a package structure according to some embodiments of the present disclosure. It is to be noted that the process steps described herein cover a portion of the manufacturing processes used to fabricate a package structure. The embodiments are intended to provide further explanations but are not used to limit the scope of the present disclosure.

Figure 2A:
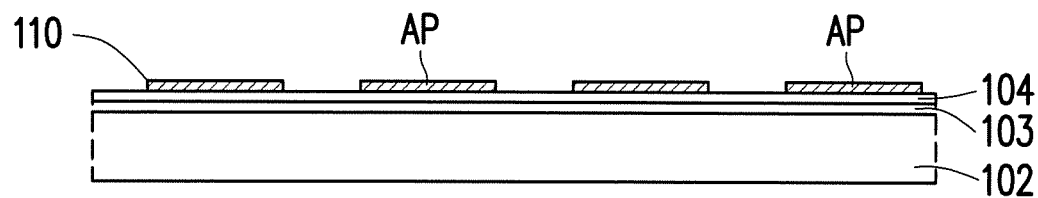
FIGS. 2A-2J are the schematic cross-sectional views showing the package structure at various stages of the method of fabricating a package structure according to some embodiments of the present disclosure.

In accordance with some embodiments, referring to step S100 in FIG. 1 and as shown in FIG. 2A, a carrier 102 is provided. In some embodiments, the carrier 102 may be a glass carrier or any suitable carrier for the manufacturing method of the package structure. In some embodiments, the carrier 102 is provided with a debond layer 103 and a buffer layer 104 formed thereon. In some embodiments, the debond layer 103 functions as a temporary bonding layer suitable for bonding/debonding the carrier 102 from the above layers disposed thereon. In some embodiments, the polymer layer 103 may include a release layer (such as a light-to-heat conversion ("LTHC") layer) and an adhesive layer (such as a ultra-violet curable adhesive or a heat curable adhesive layer). Referring to FIG. 2A, in some embodiments, the buffer layer 104 includes a dielectric layer made of a dielectric material including polyimide, benzocyclobutene ("BCB"), polybenzooxazole ("PBO"), or any other suitable polymer-based dielectric material. In certain embodiments, a first metallic pattern 110 is formed on the buffer layer 104 and over the debond layer 103 and the carrier 102. In exemplary embodiments, the first metallic pattern 110 is formed by forming a first metallization layer (not shown) by electroplating or deposition over the carrier 102 and then patterning the metallization layer by photolithographic and etching processes. In some embodiments, the material of the first metallization layer includes aluminum, titanium, copper, nickel, tungsten, and/or alloys thereof.

In some embodiments, the first metallic pattern 110 at least includes a plurality of antenna patterns AP. In certain embodiments, the antenna patterns AP are arranged as arrays such as the N×N array or N×M arrays (N, M>0). FIG. 4A is an exemplary top view showing the exemplary layout of antenna patterns AP in the first metallic pattern of a package structure according to some embodiments of the present disclosure. As shown in FIG. 3A, in some embodiments, the antenna patterns AP on the buffer layer 104 are shown as square metallic blocks arranged as the 4×6 array.

Figure 2B:
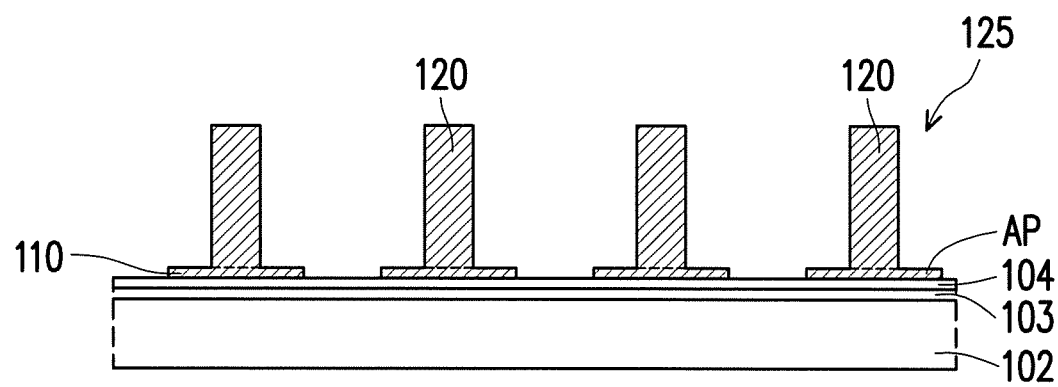

Referring to FIG. 2B and in Step S102 of FIG. 1, in some embodiments, through interlayer vias ("TIVs") 120 are formed on the antenna patterns AP of the first metal pattern 110 over the carrier 102. In certain embodiments, except for the TIVs 120 form on the antenna patterns AP, one or some TIVs 120 may be formed on the buffer layer 104. In some embodiments, the TIVs 120 are formed on the antenna patterns AP and physically connected to the antenna patterns AP. In some embodiments, the antenna structure 125 includes the antenna patterns AP. In some embodiments, the antenna patterns AP and the TIVs 120 connected to the antenna patterns AP constitute an antenna structure 125. In some embodiments, the formation of the TIVs 120 includes forming a mask pattern (not shown) with openings, then forming a metallic material (not shown) filling up the openings by electroplating or deposition, and removing the mask pattern to form the TIVs 120. The material of the TIVs 120 may include copper, copper alloys, nickel, tungsten or other suitable metal materials. However, it is appreciated that the scope of this disclosure is not limited to the materials and descriptions disclosed above.

Figure 4A:
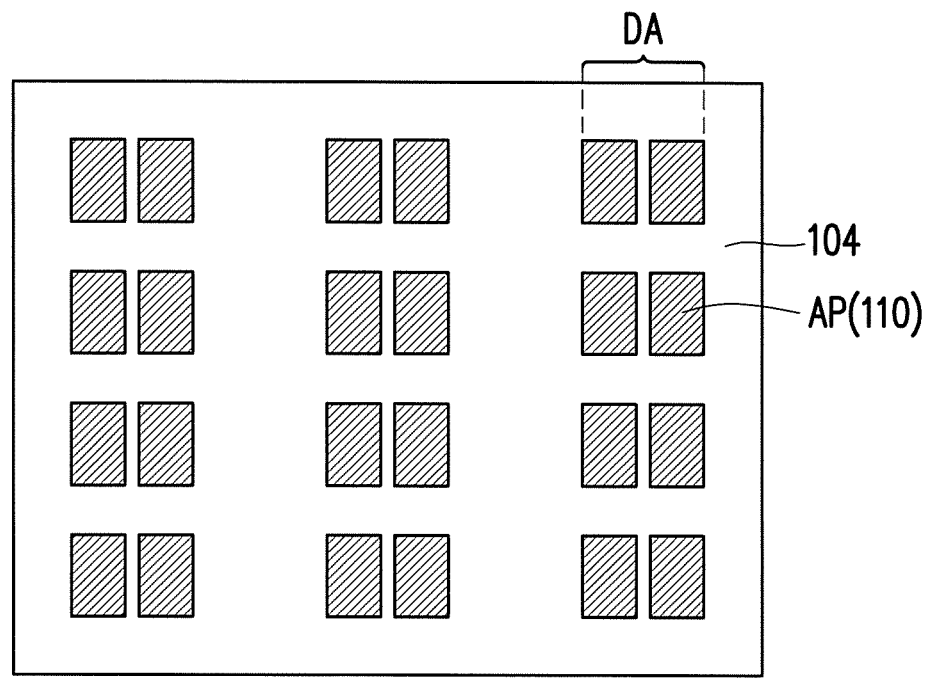
FIGS. 4A & 4C are the exemplary top views showing exemplary layouts of portions of a package structure according to some embodiments of the present disclosure.
Figure 4B:
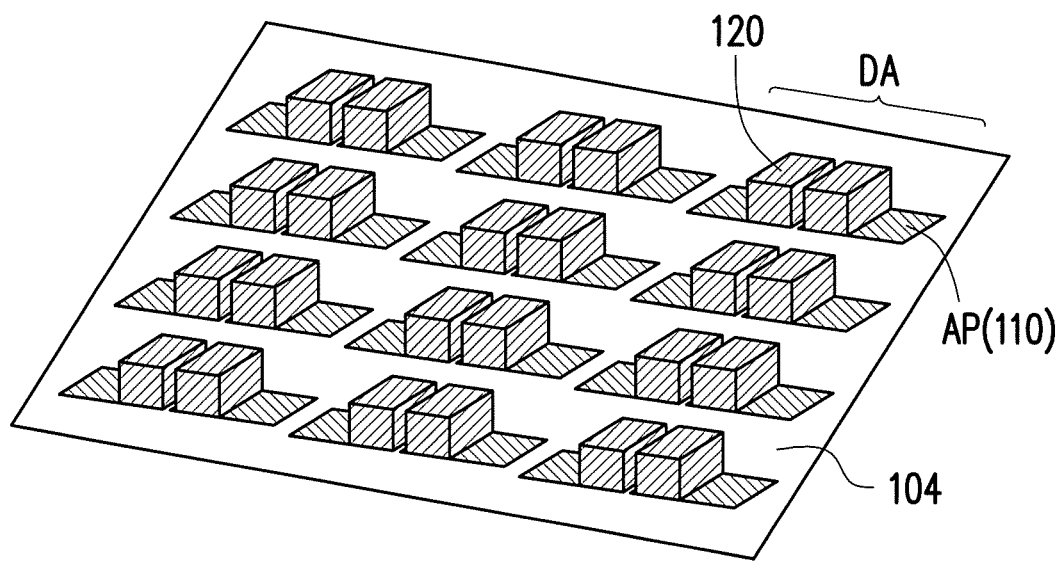
FIG. 4B is an exemplary three-dimensional view showing exemplary layouts of portions of a package structure according to some embodiments of the present disclosure.

In some embodiments, the TIVs 120 are formed on the antenna patterns AP in specific corresponding arrangements. FIG. 4B is an exemplary three-dimensional view showing the exemplary layout of antenna patterns AP and the corresponding layout of the TIVs 120 connected to the antenna patterns AP of a package structure according to some embodiments of the present disclosure. As shown in FIG. 4B, in some embodiments, the antenna patterns AP are metallic blocks arranged as the 4×6 array (row×column) and each of the metal blocks is connected to one of the TIVs 120 in a one-to-one relationship. In certain embodiments, pairs of the antenna patterns AP and the TIVs 120 constitute dipole antennas DA arranged as the 4×3 array. In certain embodiments, the array of the dipole antennas DA may constitute array antennas. In one embodiment, the two metal blocks (antenna patterns AP) function as conductive elements of the dipole antenna DA and the TIVs 120 function as feedlines respectively connected to the two conductive elements of the dipole antenna DA. However, it is appreciated that layouts and arrangements of the antenna patterns and the TIVs may vary depending on the designs or electrical property requirements of the product, and the scope of this disclosure is not limited to the examples and descriptions disclosed above.

Figure 2C:
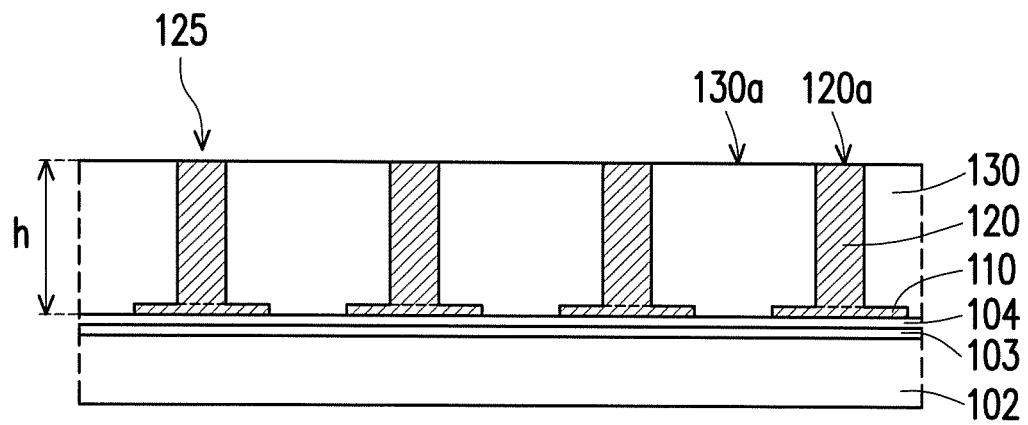

Referring to FIG. 2C and in Step S104 of FIG. 1, in some embodiments, a first molding compound 130 is formed over the carrier 102, the first metallic pattern 110 on the buffer layer 104 and the TIVs 120 located over the carrier 102. In some embodiments, the first molding compound 130 covers the buffer layer 104, the first metallic pattern 110 and fills between the TIVs 120. In certain embodiments, the first molding compound 130 substantially encapsulates the TIVs 120 but the top surfaces 120a of the TIVs 120 are exposed. In some embodiments, the formed molding compound 130 completely encapsulates the TIVs 120 and then a planarization process is performed to partially remove the first molding compound 130 to expose the top surfaces 120a of the TIVs 120. That is, the surface 130a of the first molding compound 130 is coplanar and flush with the top surfaces 120a of the TIVs 120.

In some embodiments, the first molding compound 130 is formed on the buffer layer 104 and covers the first metallic pattern 110 and the TIVs 120. In some embodiments, the molding compound 130 includes, for example, epoxy resins or any other suitable type of molding materials. In some embodiments, the material of the molding compound 130 has low permittivity (Dk) and low loss tangent (DO properties. Depending on the frequency range of the high speed applications, suitable materials of the molding compound may be selected based on the required electrical properties of the package. In some embodiments, for high frequency applications, the material of the molding compound 130 may possess low permittivity (Dk) with a Dk value lower than 4.0 and low loss tangent (DO with a Df value below 0.01, measured at 10 GHz. In some embodiments, the molding compound 130 encapsulates the TIVs 120 (with the top surfaces 120a exposed) and has a height h (from the top surface 130a of the molding compound 130 to the top surface of the buffer layer 104).

Figure 2D:
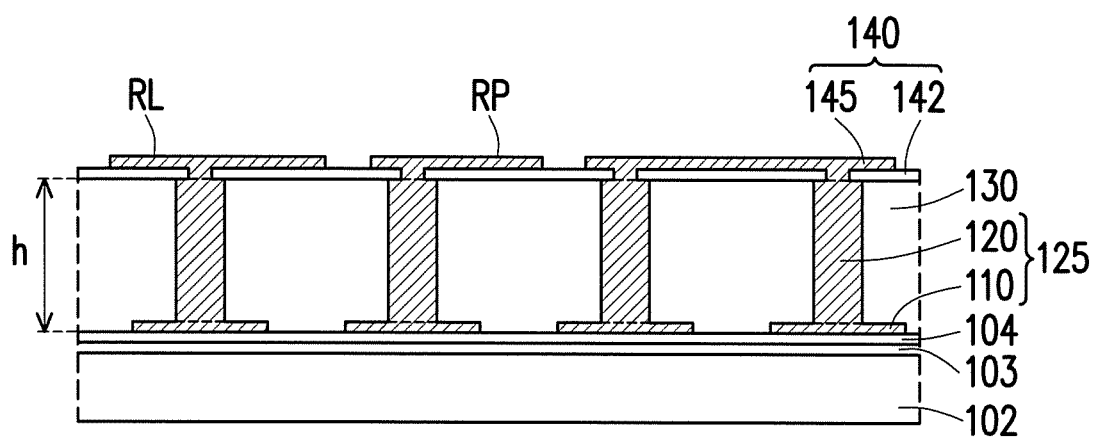

Referring to FIG. 2D and in Step S106 of FIG. 1, in some embodiments, a redistribution structure 140 is formed on the molding compound 130 and on the TIVs 120. In some embodiment, the formation of the redistribution structure 140 may comprise forming a second metallic pattern 145 within a dielectric layer 142. In some embodiments, forming the redistribution structure 140 includes forming a dielectric material layer (not shown), then patterning the dielectric material layer to form the dielectric layer 142 with openings. In some embodiments, the material of the dielectric material layer includes polyimide, benzocyclobutene or polybenzoxazole. Later, a second metallization layer (not shown) is formed within the openings and fills up the openings, and then the second metallization layer is patterned to the second metallic pattern 145. In some embodiments, the material of the second metallization layer includes aluminum, titanium, copper, nickel, tungsten, and/or alloys thereof. In some embodiments, the second metallic pattern 145 is electrically connected to the TIVs 120.

Figure 4C:
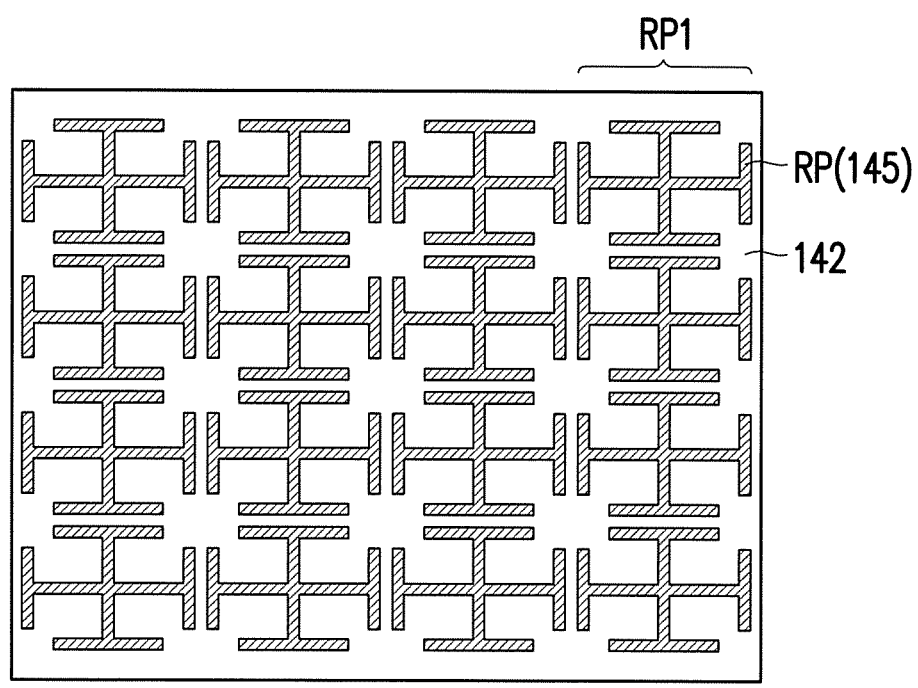

In some embodiments, the second metallic pattern 145 includes at least a routing pattern RL and a reflector pattern RP. In some embodiments, the routing pattern RL includes routing lines and/or contacts or assisting electrical connection to the above layers and to the below layers. In certain embodiments, the reflector pattern RP includes a plurality of sub-patterns RP1 arranged as arrays such as the N×N array or N×M arrays (N, M>0). FIG. 4C is an exemplary top view showing the exemplary layout of sub-patterns RP1 of the reflector pattern RP of a package structure according to some embodiments of the present disclosure. As shown in FIG. 4C, in some embodiments, each of the sub-patterns RP1 is shaped as one type of planar square split ring resonators (SRRs) having a framed cross with gaps (splits) at four corners. Alternatively, in some embodiments, the sub-patterns RP1 may be shaped as circle SRRs, square SRRs, complimentary square SRRs or complimentary circle SRRs. In FIG. 4C, in one embodiment, the sub-patterns RP1 are electromagnetic band-gap (EBG) structures arranged as the 4×4 array. In some embodiment, the locations of the sub-patterns RP1 are aligned with the locations of the corresponding dipole antennas DA or correspond to the locations of the antenna patterns AP. In some embodiments, the locations of the sub-patterns RP1 are not necessarily aligned with the locations of the corresponding dipole antennas DA or need not to correspond to the locations of the antenna patterns AP. In some embodiments, the reflector pattern RP may also function as the ground plane for the antenna patterns AP. Owing to the layouts of the antenna & reflector patterns and the packed-together arrangements of the antenna structure and the reflector pattern, the subsequently obtained package becomes rather compact. However, it is appreciated that layouts and arrangements of the antenna patterns and the sub-patterns may vary depending on the designs or electrical property requirements of the product, and the scope of this disclosure is not limited to the examples and descriptions disclosed above.

In some embodiments, the reflector pattern RP functions as the reflector for the antenna structure 125 (composed of DA). By using the electromagnetic band-gap (EBG) structures as the high-impedance reflector, the minimal distance required between the antenna and the ground plane (the reflector pattern) can be significantly reduced and high gain performance enhancement can be obtained. That is, the height h of the molding compound 130 may be much smaller than $0.25\lambda$ ($\lambda$ is the wavelength of the electromagnetic wave to be received or transmitted by the antenna), and the height h may be as small as about $0.01\lambda$. Taking high-speed wireless broadband communication technology as an example, millimeter waves applicable for services on mobile and wireless networks have short wavelengths ranging from 10 millimeters to 1 millimeter. In this case, for 60 GHz-77 GHz applications, the required height h may be as small as about 40 microns.

Figure 2E:
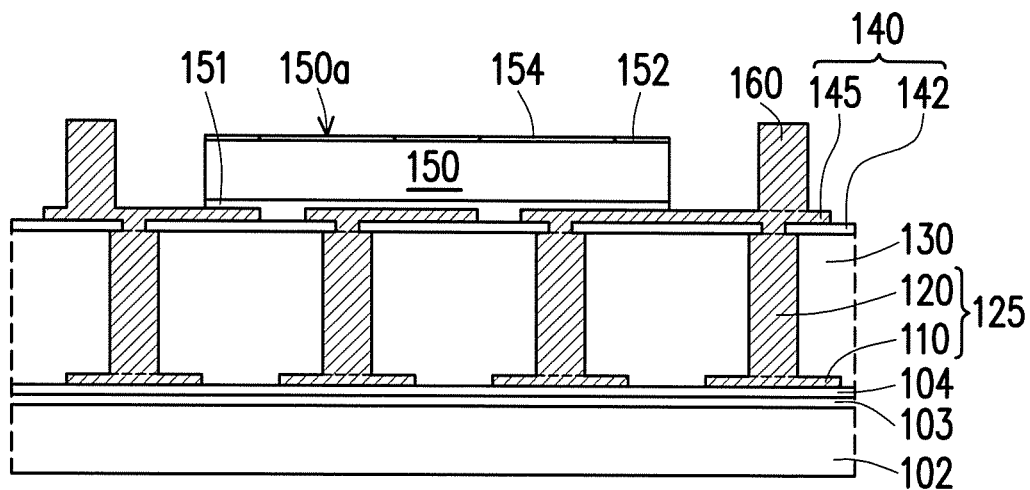

Referring to FIG. 2E and in Step S108 of FIG. 1, at least one die 150 is provided and a plurality of through vias 160 is formed on the redistribution structure 140. In FIG. 2E, only one die and only two through vias are presented for illustrative purposes, however, it should be noted that one or more dies may be provided and more than two through vias may be formed. The die(s) described herein may be referred as a chip or an integrated circuit (IC). In some embodiments, the die 150 has a passivation layer 152 and a plurality of conductive pads 154 formed thereon. In one embodiment, the passivation layer 152 covers active surface 150a of the die 150 but exposing the conductive pads 154 for further electrical connections. In one embodiment, a die attach film 151 may be provided between the redistribution structure 140 and the die 150 placed on the redistribution structure 140. In some embodiments, the die 150 includes at least one wireless and radio frequency (RF) chip. In some embodiments, the die 150 may further include additional chip(s) of the same type or different types. In alternative embodiments, more than one die 150 are provided, and the dies 150, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips.

As shown in FIG. 2E, in some embodiments, the through vias 160 are through integrated fan-out ("InFO") vias formed on the second metallic pattern 145 over the first molding compound 130. In some embodiments, the through vias 160 are physically connected to the second metallic pattern 145 and are electrically connected to the antenna structure 125 (at least electrically connected to antenna patterns AP and the TIVs 120). In some embodiments, the through vias 160 are arranged beside the die 150 and surround the die 150. In some embodiments, the formation of the through vias 160 includes forming a mask pattern (not shown) with openings, then forming a metallic material (not shown) filling up the openings by electroplating or deposition, and removing the mask pattern to form the through vias 160. The material of the through vias 160 may include copper, copper alloys, nickel, tungsten or other suitable metal materials. However, it is appreciated that the scope of this disclosure is not limited to the materials and descriptions disclosed above.

Figure 2F:
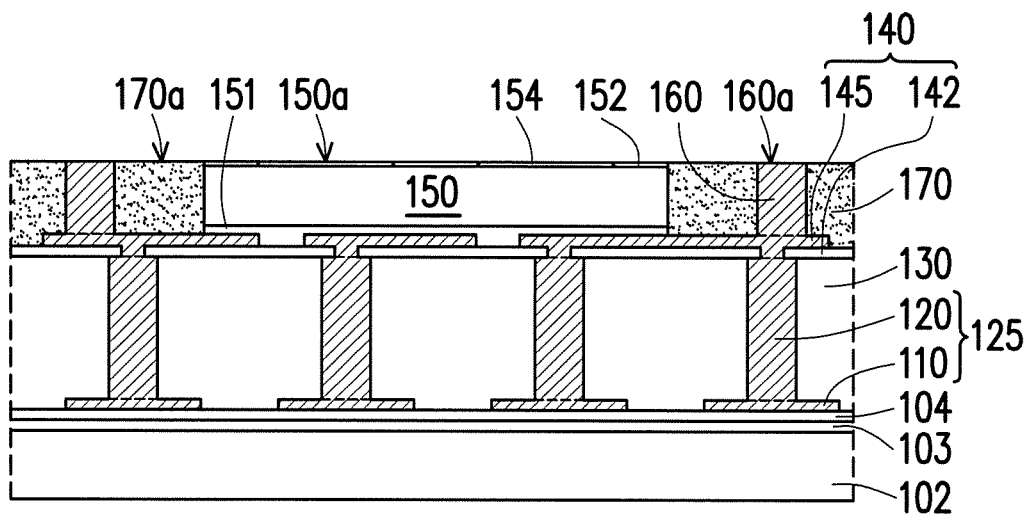

Referring to FIG. 2F and in Step S110 of FIG. 1, in some embodiments, a second molding compound 170 is formed over the redistribution structure 140 covering the second metallic pattern 145 and filling between the through vias 160 and the die 150. In some embodiments, the second molding compound 170 covers and encapsulates the die 150 and the through vias 160, but the top surfaces 160a of the through vias 160 and the conductive pads 154 on the active surface 150a of the die 150 are exposed. In some embodiments, the formed second molding compound 170 completely encapsulates the die 150 and the through vias 160, and then a planarization process is performed to partially remove the second molding compound 170 to expose the top surfaces 160a of the through vias 160 and the conductive pads 154. That is, the top surface 170a of the second molding compound 170 is flush and coplanar with the top surfaces 160a of the through vias 160. In some embodiments, the second molding compound 170 includes, for example, epoxy resins or any other suitable type of molding materials.

Figure 2G:
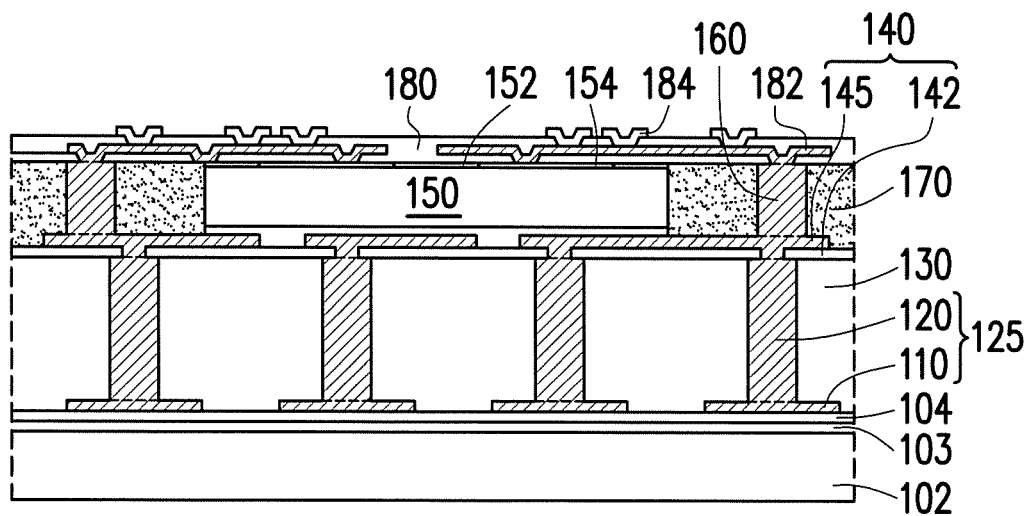

Referring to FIG. 2G and in Step S112 of FIG. 1, in some embodiments, a redistribution structure 180 is formed on the second molding compound 170 covering the through vias 160 and the die 150. The redistribution structure 180 is electrically connected with the die 150 and the through vias 160 and is electrically connected to the antenna structure 125 through the redistribution structure 140 and the vias 160. The formation of the redistribution structure 180 includes sequentially forming one or more polymer dielectric material layers and one or more metallization layers in alternation. In some embodiments, the material of the metallization layer(s) includes aluminum, titanium, copper, nickel, tungsten, and/or alloys thereof. In some embodiments, the material of the polymer dielectric material layer(s) includes polyimide, benzocyclobutene, polybenzo-oxazole, or any other suitable polymer-based dielectric material. In some embodiments, the redistribution structure 180 includes a front-side redistribution layer having a bottom metallization layer 182 physically and electrically connected to the conductive pads 154 of the die 150 and the through vias 160, and an under bump metal (UBM) layer 184 for assisting ball mounting. In some embodiments, the materials of the UBM layer 184 include copper, nickel, aluminum, tungsten or alloys thereof. In certain embodiments, the redistribution structure 180 extends beyond the span of the die and may be considered as a fan-out redistribution structure. It should be noted that the redistribution structure 180 is not limited to include two dielectric layers and/or two metallization layers as shown in FIG. 2G.

Figure 2H:
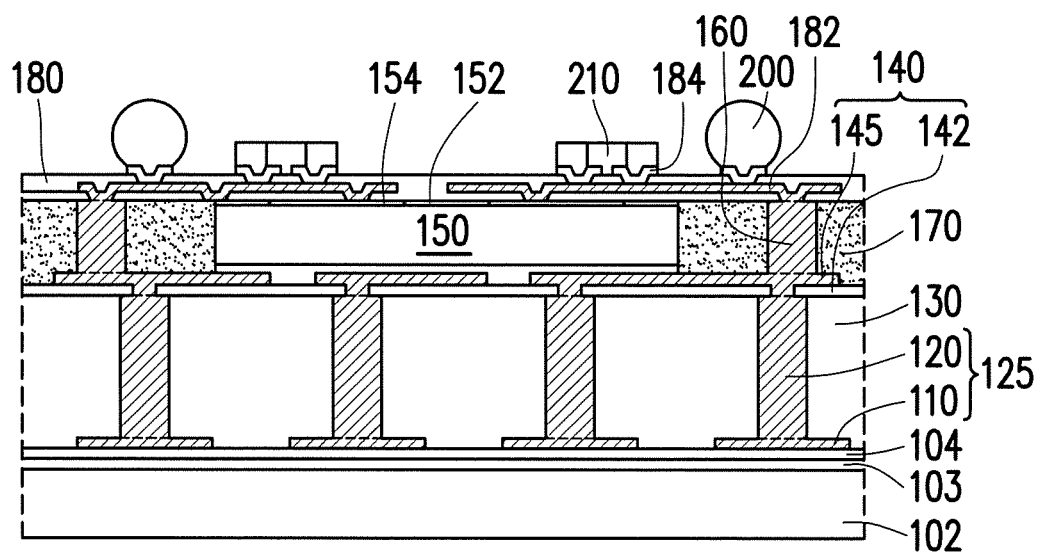

Referring to FIG. 2H and in Step S114 of FIG. 1, in some embodiments, a plurality of solder balls 200 is formed on the redistribution structure 180. In one embodiment, the solder balls 200 are disposed on the UBM layer 184. In some embodiments, some of the solder balls 200 are electrically connected to the die 150 and some of the solder balls 200 are electrically connected to the antenna structure 125 through the redistribution structure 180, the through vias 160 and the redistribution structure 140. In some embodiments, the solder balls 200 are attached to the UBM layer 184 through a solder flux.

Referring to FIG. 2H, one or more integrated passive device (IPD) 210 are disposed on the redistribution structure 180. Only two IPDs 210 are present in FIG. 2H for illustrative purposes, but the number of IPD 210 to be mounted on the redistribution structure is not particularly limited to the embodiments and can be varied based on design requirements. In some embodiments, the IPDs 210 are, for example, capacitors, resistors, inductors and/or the like.

In some embodiments, the solder balls 200 are disposed adjacent to the IPD 210. In certain embodiments, the solder balls 200 are arranged at locations corresponding to the locations of the through vias 160. In certain embodiments, the solder balls 200 are arranged to surround the IPDs 210. In certain embodiments, the solder balls 200 are disposed on the redistribution structure 180 before or after the IPD 210 is disposed on the redistribution structure 180.

Figure 2I:
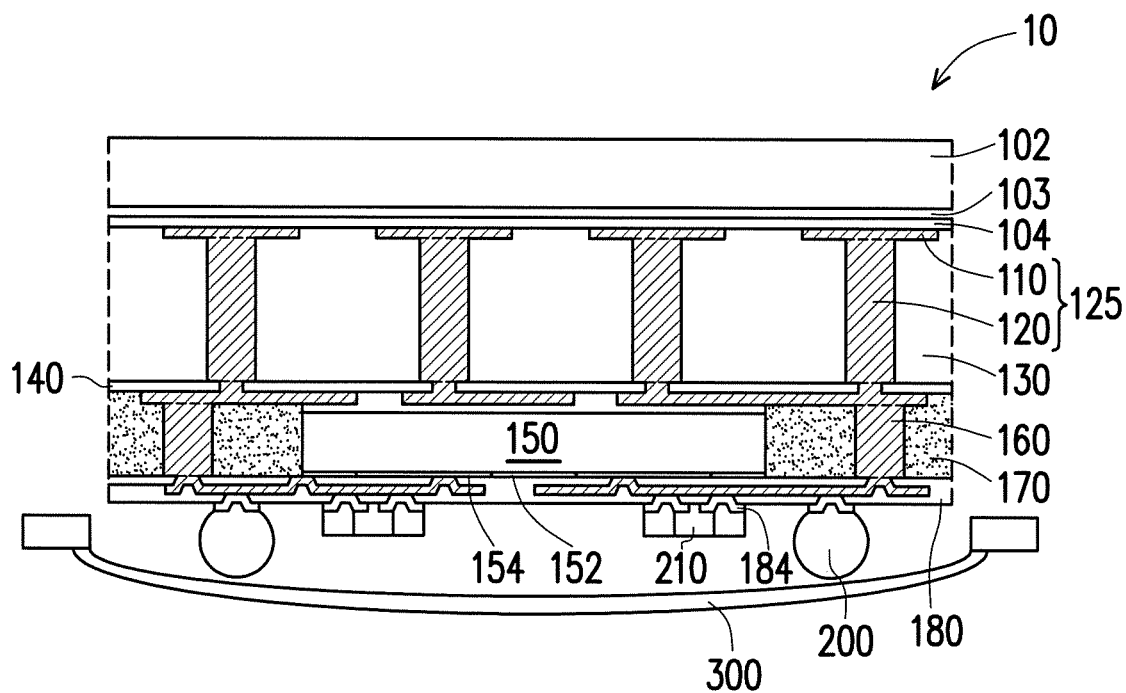

Referring to FIG. 2I and in Step S116 of FIG. 1, a whole package 10, including the first metallic pattern 110, the TIVs 120, the first molding compound 130, the redistribution structure 140, the die 150, the through vias 160, the second molding compound 170 and the redistribution structure 180, is turned upside down and disposed on a carrier film 300.

Figure 2J:
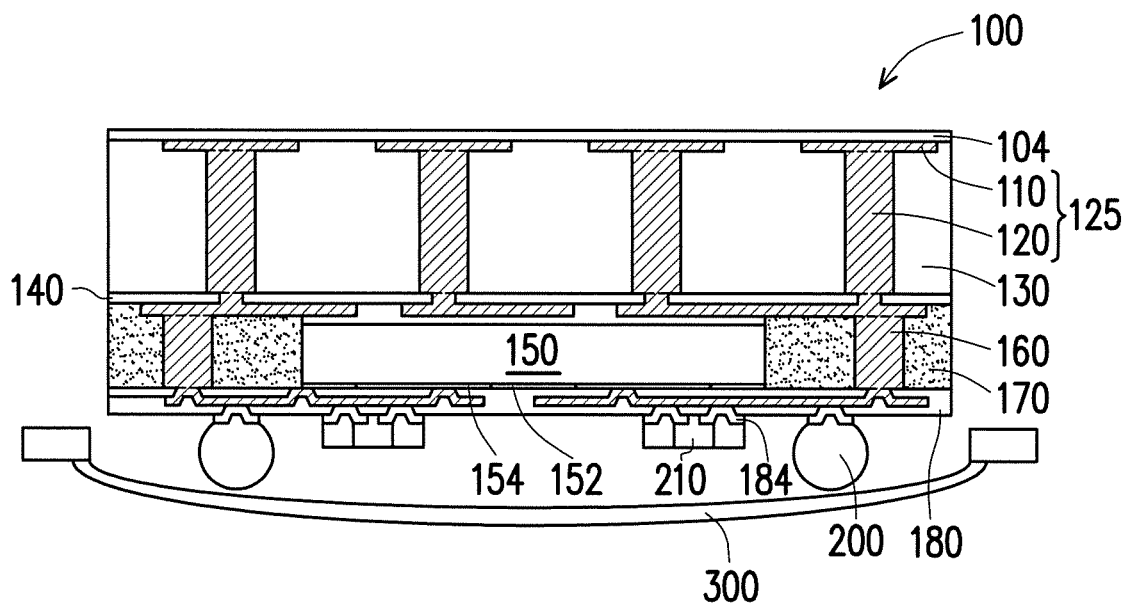

In some embodiments, as shown in FIG. 2J and in Step S118 of FIG. 1, the carrier 102 is removed and a dicing process is performed. In some embodiments, the package 10 is detached from the carrier 102 through a debonding process and the carrier 102 and the debond layer 103 are removed. As the package 10 is separated from the carrier 102, the buffer layer 104 is exposed. In some embodiments, the buffer layer 104 remains on the antenna structure 125 as a protection layer. Alternatively, in some embodiments, the buffer layer 104 may be subsequently removed. In some embodiments, a dicing process is performed to cut the whole package structure 10 (at least cutting though the first and second molding compounds 130, 170) along the cutting lines (shown as dotted lines) into individual and separate semiconductor packages 100 (only one semiconductor package 100 is shown in the drawings). In one embodiment, the dicing process is a wafer dicing process including mechanical blade sawing or laser cutting.

Figure 3:
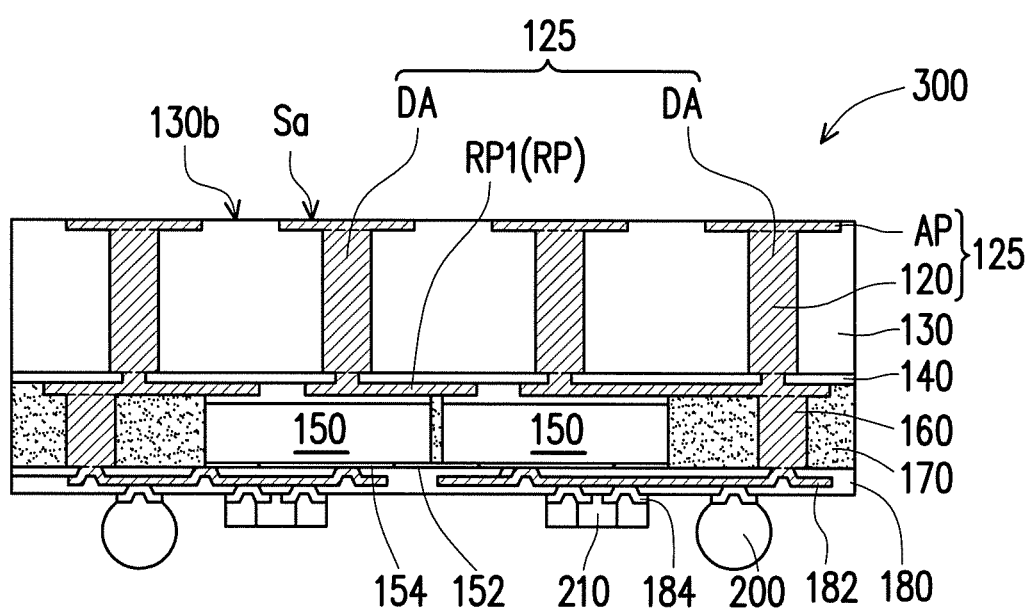
FIG. 3 is the schematic cross-sectional view showing a package structure according to some embodiments of the present disclosure.

FIG. 3 is the schematic cross-sectional view showing a package structure according to some embodiments of the present disclosure. The package structure 300 at least comprises the first metallic pattern 110, the TIVs 120, the first molding compound 130, the redistribution structure 140, the die 150, the through vias 160, the second molding compound 170 and the redistribution structure 180.

In FIG. 3, the semiconductor package 30 similar to the structure as shown in FIG. 2J is described, except two dies 150 are included and the buffer layer 104 is omitted. Referring to FIG. 3, in exemplary embodiments, the semiconductor package 300 comprises a redistribution structure 180, the dies 150 disposed on the redistribution structure 180, a molding compound 170 disposed on the redistribution structure 180 and encapsulating the dies 150, and through vias 160 disposed on the redistribution structure 180 and penetrating through the molding compound 170. In some embodiments, at least one of the dies 150 is a wireless and radio frequency (RF) chip. In some embodiments, solder balls 200 are mounted on the redistribution structure 180 and some of the solder balls 200 are electrically connected to the dies 150 through the redistribution structure 180. Also, in some embodiments, some of the solder balls 200 are electrically connected to the antenna structure 125 through the redistribution structure 180 and the through vias 160. In certain embodiments, one or more IPDs 210 are mounted on the redistribution structure 180. In some embodiments, a redistribution structure 140 including a reflector pattern RP is located on the molding compound 170. In some embodiments, the through vias 160 are arranged aside and surrounding the dies 150, and the through vias 160 electrically connects the redistribution structure 140 and the redistribution structure 180. In certain embodiments, the reflector pattern RP of the redistribution structure 140 includes a plurality of sub-patterns RP1 arranged as arrays. In some embodiments, the sub-patterns RP1 may be shaped as one or more types of square split ring resonators (SRRs), circle SRRs, complimentary square SRRs and complimentary circle SRRs. In one embodiment, the sub-patterns RP1 may be shaped as a planar framed cross with gaps (splits) at four corners.

In FIG. 3, another molding compound 130 and an antenna structure 125 are disposed on the redistribution structure 140 and located above the dies 150 and the molding compound 170. In some embodiments, the antenna structure 125 includes dipole antennas DA encapsulated by the molding compound 130. In certain embodiments, the dipole antennas DA are constituted by TIVs 120 and the antenna patterns AP connected to the TIVs 120. In some embodiments, the top surfaces of the antenna patterns AP are exposed from the molding compound 130 (not covered by the molding compound 130). In certain embodiments, the top surfaces of the antenna patterns AP are coplanar and leveled with the top surface of the molding compound 130, as shown in FIG. 3. In some embodiments, the antenna patterns AP are metallic blocks arranged as an array. In certain embodiments, the antenna patterns AP are connected to the TIVs 120 in specific relationships. In certain embodiments, pairs of the antenna patterns AP and the TIVs 120 constitute dipole antennas DA arranged as an array. In certain embodiments, the array of the dipole antennas DA may constitute an array antenna structure.

In accordance with some embodiments in the present disclosure, compared with the area-consuming arrangement of the antenna(s) and/or passive component(s) arranged at the same level but around the package die, the antenna that are laid directly above the die and integrated into the package structures just occupy little footprint area, so as to provide small footprint and compact package structures. Also, the reflector pattern that is arranged right above the die and incorporated into the backside redistribution layer further reduce the height (or thickness) of the package structure and improves the gain performance of the package. In such package structure designs disclosed in the present disclosure, the antenna structure and/or the reflector is electrically connected to the underlying die through the redistribution layer, the through vias and/or the redistribution structure, thus providing better electrical performance with short electrical paths.

In some embodiments of the present disclosure, a package structure is provided. The package structure comprises a die, a first molding compound surrounding the die and through vias disposed beside and around the die and penetrating through the first molding compound. A reflector pattern is disposed on the die and the through vias. The reflector pattern is electrically connected to the through vias. An antenna structure is disposed on the reflector pattern and electrically connected with the reflector pattern and the die. A second molding compound is disposed on the reflector pattern and surrounds the antenna structure.

In some embodiments of the present disclosure, a package structure is provided. The package structure comprises at least one die, a first molding compound surrounding the at least one die and through vias disposed around the at least one die and penetrating through the first molding compound. A redistribution layer is disposed on the first molding compound and the at least one die. The redistribution layer comprises a reflector pattern disposed on the at least one die and electrically connected to the through vias. An antenna structure is disposed on the reflector pattern. A second molding compound is disposed on the reflector pattern and surrounds the antenna structure.

In some embodiments of the present disclosure, a method of fabricating a package structure is described. A first metallic pattern having a plurality of antenna patterns is formed on a carrier. Through interlayer vias (TIVs) are formed on the plurality of antenna patterns of the first metallic pattern. A first molding compound is formed on the first metallic pattern and covers the TIVs. A redistribution layer comprising a reflector pattern is formed on the first molding compound and on the TIVs. Through vias are formed on the redistribution layer and a die is disposed on the redistribution layer. A second molding compound is formed on the redistribution layer, encapsulating the die and the though vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a die;
    a first molding compound surrounding the die;
    through vias, disposed beside and around the die and penetrating through the first molding compound;
    a reflector pattern disposed on the die and the through vias, wherein the reflector pattern is electrically connected to the through vias;
    an antenna structure, disposed on the reflector pattern and electrically connected with the reflector pattern and the die, wherein the antenna structure includes antenna patterns and through interlayer vias connected to the antenna patterns; and
    a second molding compound, disposed on the reflector pattern and laterally wrapping the antenna patterns and the through interlayer vias of the antenna structure, wherein top surfaces of the antenna patterns are coplanar and flush with a top surface of the second molding compound.

2. The package structure according to claim 1, wherein the die comprises at least one wireless and radio frequency chip.

3. The package structure according to claim 1, wherein the antenna patterns are metal blocks arranged as an array, and pairs of the metal blocks and the through interlayer vias connected to the metal blocks constitute dipole antennas.

4. The package structure according to claim 1, wherein the reflector pattern includes sub-patterns arranged as an array and the antenna structure is electrically connected to the reflector pattern.

5. The package structure according to claim 4, wherein the sub-patterns are shaped as split ring resonators.

6. The package structure according to claim 1, wherein top surfaces of the antenna patterns are exposed from the second molding compound.

7. A package structure, comprising:
    at least one die;
    a first molding compound surrounding the at least one die;
    through vias, disposed around the at least one die and penetrating through the first molding compound;
    a redistribution layer, disposed on the first molding compound and the at least one die, wherein the redistribution layer comprises a reflector pattern disposed on the at least one die and electrically connected to the through vias;
    an antenna structure disposed on the reflector pattern, wherein the antenna structure includes antenna patterns and through interlayer vias connected to the antenna patterns in a one-to-one relationship; and
    a second molding compound, disposed on the reflector pattern and laterally wrapping the antenna patterns and the through interlayer vias of the antenna structure, wherein the antenna patterns are exposed from a top surface of the second molding compound.

8. The package structure according to claim 7, further comprising a redistribution structure disposed on the first molding compound and solder balls disposed on the redistribution structure, wherein the redistribution structure is electrically connected to the at least one die and the though vias and the solder balls are electrically connected to the at least one die and the antenna structure.

9. The package structure according to claim 7, wherein the at least one die comprises a wireless and radio frequency chip, and the antenna structure is an array antenna structure.

10. The package structure according to claim 7, wherein the at least one die comprises a wireless and radio frequency chip, the reflector pattern includes sub-patterns and locations of the sub-patterns correspond to locations of the antenna patterns.

11. The package structure according to claim 7, wherein the at least one die comprises a wireless and radio frequency chip, and pairs of the antenna patterns and the through interlayer vias constitute dipole antennas.

12. The package structure according to claim 7, wherein the at least one die comprises a wireless and radio frequency chip, and the reflector pattern includes sub-patterns arranged as an array and the sub-patterns are shaped as split ring resonators.

13. The package structure according to claim 7, wherein the antenna structure is electrically connected to the at least one die and the reflector pattern is electrically connected with the antenna structure.

14. A method of fabricating a package, comprising:
    providing at least one die;
    forming a first molding compound surrounding the at least one die;
    forming through vias around the at least one die and penetrating through the first molding compound;
    forming a redistribution layer on the first molding compound and the at least one die, wherein the redistribution layer comprises a reflector pattern disposed on the at least one die and electrically connected to the through vias;
    forming an antenna structure on the reflector pattern, wherein the antenna structure includes antenna patterns and through interlayer vias connected to the antenna patterns in a one-to-one relationship; and
    forming a second molding compound on the reflector pattern and laterally wrapping the antenna patterns and the through interlayer vias of the antenna structure, wherein the antenna patterns are exposed from a top surface of the second molding compound.

15. The method according to claim 14, further comprising forming a redistribution structure disposed on the first molding compound and solder balls on the redistribution structure, wherein the redistribution structure is electrically connected to the at least one die and the though vias and the solder balls are electrically connected to the at least one die and the antenna structure.

16. The method according to claim 14, wherein the at least one die comprises a wireless and radio frequency chip, and the antenna structure is an array antenna structure.

17. The method according to claim 14, wherein the at least one die comprises a wireless and radio frequency chip, the reflector pattern includes sub-patterns and locations of the sub-patterns correspond to locations of the antenna patterns.

18. The method according to claim 14, wherein the at least one die comprises a wireless and radio frequency chip, and pairs of the antenna patterns and the through interlayer vias constitute dipole antennas.

19. The method according to claim 14, wherein the at least one die comprises a wireless and radio frequency chip, and the reflector pattern incudes sub-patterns arranged as an array and the sub-patterns are shaped as split ring resonators.

20. The method according to claim 14, wherein the antenna structure is electrically connected to the at least one die and the reflector pattern is electrically connected with the antenna structure.

* * * * *